US007078976B2

(12) United States Patent
Blednov

(10) Patent No.: US 7,078,976 B2
(45) Date of Patent: Jul. 18, 2006

(54) HIGH POWER DOHERTY AMPLIFIER

(75) Inventor: Igor Ivanovich Blednov, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/524,571

(22) PCT Filed: Jul. 18, 2003

(86) PCT No.: PCT/IB03/03278

§ 371 (c)(1),
(2), (4) Date: Feb. 15, 2005

(87) PCT Pub. No.: WO2004/017512

PCT Pub. Date: Feb. 26, 2004

(65) Prior Publication Data

US 2005/0231278 A1    Oct. 20, 2005

(30) Foreign Application Priority Data

Aug. 19, 2002  (EP)  .................... 02078421

(51) Int. Cl.
    *H03F 3/60*    (2006.01)
(52) U.S. Cl. ................ 330/286; 330/53; 330/124 R; 330/295; 330/302
(58) Field of Classification Search ........... 330/53, 330/124 R, 286, 295, 302
See application file for complete search history.

(56) References Cited

U.S. PATENT DOCUMENTS 6,320,462 B1* 11/2001 Alley ................ 330/124 R (Continued)

OTHER PUBLICATIONS

"Optimum design for linearity and efficiency of a Microwave Doherty Amplifier using a new load matching technique". by Youngoo Yang and others, in Microwave Journal, Dec. 2001.
"Experimental Investigation on Efficiency and Linearity of Microwave Doherty Amplifier" by Youngoo Yang et al., pp. 1367-1370, *IEEE MIT-S Digest*.

*Primary Examiner*—John D. Lee
(74) *Attorney, Agent, or Firm*—Aaron Waxler

(57)  ABSTRACT

A high power Doherty amplifier circuit having at least one input terminal and at least one output terminal comprising at least one carrier transistor (30) forming a main amplifier stage; at least one peak transistor (32) forming a peak amplifier stage; a first input line (27) connecting the input terminal (28) to an input (29) of the carrier transistor (30); a second input line (31) connecting the input terminal (28) to an input (63) of the peak transistor (32); a first output line (33) connecting the output terminal (56) to an output (49) of the carrier transistor (30); and a second output line (35) connecting the output terminal (56) to an output (75) of the peak transistor (32). A high power Doherty amplifier circuit package comprising a support structure (104) supporting circuit elements of the Doherty amplifier circuit; at least one input terminal (102) and at least one output terminal (96) both terminals being supported on the support structure (104); at least one carrier transistor (92) forming a main amplifier stage and at least one peak transistor (98) forming a peak amplifier stage both transistors being supported on the support structure (104); a first input network (106) connecting the input terminal (102) to an input of the carrier transistor (92); a second input network (100, 114, 116) connecting the input terminal (102) to an input of the peak transistor (98); a first output network (94, 108, 110) connecting the output terminal (96) to an output of the carrier transistor (92); and a second output network (112) connecting the output terminal (96) to an output of the peak transistor (98), and wherein the input and output networks are artificial transmission lines comprising serial circuits and/or parallel circuits of at least one capacitance and/or at least one inductance.

16 Claims, 13 Drawing Sheets

U.S. PATENT DOCUMENTS

| | | | |
|---|---|---|---|
| 6,329,877 B1 | 12/2001 | Bowen et al. | 330/124 R |
| 6,359,513 B1 | 3/2002 | Kuo et al. | 330/276 |
| 6,469,581 B1 * | 10/2002 | Kobayashi | 330/295 |
| 6,731,173 B1 * | 5/2004 | Thompson | 330/296 |
| 6,853,245 B1 * | 2/2005 | Kim et al. | 330/124 R |

* cited by examiner

HIGH POWER DOHERTY AMPLIFIER

The present invention relates to a high power Doherty amplifier, in particular to a high power Doherty amplifier circuit and a high power Doherty amplifier circuit package.

So-called Doherty type amplifiers are known since a long time and were first implemented in vacuum tube amplifiers. Such Doherty amplifiers have a main amplifier stage and a peak amplifier stage, and (quarter wave) transmission lines between various parts of the Doherty amplifier. Well known Doherty amplification techniques require at least two active amplification devices operating in two different modes, usually A or AB class for carrier amplifiers, and B or C class for peak amplifiers, and transformation structures providing the impedance transformation and the required phase shift.

It is well known that, for Doherty amplifiers, the transformation and phase shifting structures provide a characteristic impedance, comparable to the device output impedance. In case of semiconductor power device and power level >5 . . . 10 W this required impedance is in the range of 0.5 . . . 3 Ohm.

A design example and results on microstrip line technology are described in the paper "Optimum design for linearity and efficiency of a Microwave Doherty Amplifier using a new load matching technique". by Youngoo Yang and others, in Microwave Journal, 12, 2001, which discloses a Doherty amplifier with full load matching circuits of the carrier and peaking amplifiers at both low and high power levels is demonstrated for the first time. In the circuit design, sections of transmission lines are inserted in the load matching network for providing a power-level-dependent load impedances. The circuit elements and bias points are designed and optimized using a large-signal harmonic balance simulation to offer simultaneous improvements in linearity and efficiency. Two 1.4 GHz Doherty amplifiers have been implemented using silicon LDMOS FETs. The RF performances of the Doherty amplifier-I (a combination of a class B carrier amplifier and a bias-tuned class C peaking amplifier) have been compared with those of a class B amplifier alone. The Doherty amplifier-II (a combination of a class AB carrier amplifier and a bias-tuned class C peaking amplifier) has been compared with a class AB amplifier alone. The new Doherty amplifiers show an improved linearity as well as higher efficiency. The paper describes a microstrip line implementation of Doherty technique for transistors.

The U.S. Pat. No. 6,359,513 B1 describes a CMOS class F amplifier using a differential input to eliminate even-order harmonics, thereby avoiding the need for circuits that are tuned to the second harmonic. This also minimizes the sensitivity of the design to changes in the second harmonic frequency and/or the particular component values selected for the tuned circuit sensitivity of the particular component values selected for the tuned circuit. Third-order harmonics are reduced by controlling the phase relationship between the differential inputs. Additional efficiency is achieved by dynamically controlling the impedance of the amplifier as a function of output power level.

The U.S. Pat. No. 6,359,513 B1 suggests a high efficiency power amplifier with use of F-class and Doherty amplification techniques. Its solution is about amplification technique which is operating with a signal, which is limited to the special conditions, such as a "pulse with duration equal to the one third of the modulated signal cycle period".

The objectives are to reduce the 3-rd harmonics produced by Class F amplifier; to increase the efficiency of a Class F amplifier; to reduce the harmonics and to increase the efficiency in a CMOS embodiment; and to increase the efficiency in a wide range of power in Class F amplifier. These objectives are achieved by providing differential input (180 degree) to eliminate even-order harmonics and avoid the use of circuits tuned for second harmonic, phase control between the differential inputs to reduce the third harmonics, output matching circuits configured for the third harmonics elimination, dynamic load control at lower output power by providing two additional transistors.

The U.S. Pat. No. 6,329,877 B1 discloses a power amplifier including an in-phase power splitter generating two split signals from an input signal, and two amplifiers capable of operating in different modes. The split signals are provided as respective inputs to the two amplifiers which are coupled through transmission lines such that as the first amplifier approaches the maximum power it can produce, the output from the second amplifier begins to contribute to the power amplifier output and supplements and modifies the power provided by the first amplifier thereby extending the range of input power over which the power amplifier delivers output power.

The U.S. Pat. No. 6,329,877 B1 suggests an amplifier arrangement for battery amplifiers, where the goal is to extend the range of the input over which the power amplifier delivers output power and where the input power is split between the first and the second amplifier equally in power and at the same phase, the first amplifier is an A class amplifier, the first amplifier may have an output matching network structure, the transmission line is of 50 Ohm impedance, the impedance seen by the first amplifier is growing with the second amplifier starting to open from the input power.

It is an object of the present invention to provide a high power Doherty amplifier circuit for high peak power levels and a high power Doherty amplifier circuit package for compact design and flexibility for Doherty amplification concept.

To achieve the object of the present invention a high power Doherty amplifier circuit having at least one input terminal and at least one output terminal comprising at least one carrier transistor forming a main amplifier stage; at least one peak transistor forming a peak amplifier stage; a first input line connecting the input terminal to an input of the carrier transistor; a second input line connecting the input terminal to an input of the peak transistor; a first output line connecting the output terminal to an output of the carrier transistor; and a second output line connecting the output terminal to an output of the peak transistor.

The present invention solves the problem between the required low Zo (in the range of 0.5 to 5 Ohm) of the quarter wavelength lines and the microstrip line technique limitations. It removes the limits implied by microstrip lines technique. So, a high power design, essential higher than 10 W, becomes feasible. Further, the present invention is very suitable for high power transmitters with peak power levels up to 600 W, such as W-CDMA transmitters.

According to a preferred embodiment of the invention, the first input line includes an inductor.

According to a preferred embodiment of the invention, the second input line comprises serial circuits and/or parallel circuits of at least one capacitance and/or at least one inductance.

According to a preferred embodiment of the invention, the second input line comprises an inductor.

According to a preferred embodiment of the invention, the first output line comprises serial circuits and/or parallel circuits of at least one capacitance and/or at least one inductance.

According to a preferred embodiment of the invention, the first output line comprises an inductor.

According to a preferred embodiment of the invention, the second output line comprises an inductor.

According to a preferred embodiment of the invention, the input and output networks are artificial transmission lines. The invention is based upon the insight that artificial transmission lines can be made in a very compact way, even for very low impedance values, below 1 Ohm, and further that artificial transmission lines can be easily implemented inside traditional transistor packages. Traditional technology can provide a high quality factor for this artificial transmission lines at very low impedance values and perfect repeatability. Another advantage is that the transmission line in low path filter configuration provide additional harmonic suppression at the output of the main amplifier, serving for better amplifier linearity.

According to a preferred embodiment of the invention, each of the transistors is operating at its own amplification class. Operating each transistor at its own amplification class enables to operate the amplifier at optimal efficiency.

According to a preferred embodiment of the invention, the carrier transistor and the peak transistor have individual transconductance parameters and threshold voltage values. The individual transconductance parameters and the individual threshold voltage values of the transistors enable a very efficient operation of the amplifier.

According to a preferred embodiment of the invention, the carrier transistor output and the peak transistor output are each connected to a compensation circuit. The compensation circuit eliminates the negative effects of the parasitic output capacitance of the transistors. This leads to an enhanced efficiency of the amplifier in the operational frequency band.

According to a preferred embodiment of the invention, the compensation circuit comprises a serial circuit and/or a parallel circuit of at least one inductance and/or at least one capacitance.

According to a preferred embodiment of the invention, the carrier transistor and the peak transistor are connected in parallel.

According to a preferred embodiment of the invention, the first input line and the second input line are connected in parallel.

According to a preferred embodiment of the invention, the first output line and the second output line are connected in parallel.

According to a preferred embodiment of the invention, the compensation circuits are connected in parallel.

According to a preferred embodiment of the invention, an impedance transformation circuit is connected between the input terminal/output terminal and the input network/output network. The impedance transformation circuit matches the different impedances of the terminals to the networks and vice versa.

According to a preferred embodiment of the invention, the impedance transformation circuit comprises a parallel circuit and/or a serial circuit of at least one inductance and/or at least one capacitance.

According to a preferred embodiment of the invention, the carrier transistor and the peak transistor are connected to a control circuit providing the desired dynamic controlling of amplification class parameters of the transistors. The control circuit enhances the power efficiency or supports an optimal trade-off between efficiency and linearity of the amplifier.

According to a preferred embodiment of the invention, the amplifier is integrated in a discrete RF power package. This enables to use the present invention in mobile telephones, where a low weight and a small volume are essential for application.

To achieve the object of the present invention a high power Doherty amplifier circuit package is disclosed comprising a support structure supporting circuit elements of the Doherty amplifier circuit; at least one input terminal and at least one output terminal both terminals being supported on the support structure; at least one carrier transistor forming a main amplifier stage and at least one peak transistor forming a peak amplifier stage both transistors being supported on the support structure; a first input network connecting the input terminal to an input of the carrier transistor; a second input network connecting the input terminal to an input of the peak transistor; a first output network connecting the output terminal to an output of the carrier transistor; and a second output network connecting the output terminal to an output of the peak transistor, and wherein the input and output networks are artificial transmission lines comprising serial circuits and/or parallel circuits of at least one capacitance and/or at least one inductance. The present invention implements the artificial transmission lines inside the RF power transistor package close to the power transistor dies. Than a low characteristic impedance, even below 1 Ohm, can be achieved, allowing a compact design and the Doherty technique implemented in the most efficient way According to a preferred embodiment of the invention, a compensation circuit is connected to the output of the transistor. The compensation circuit enhances the efficiency and/or operational frequency bandwidth of the present invention.

According to a preferred embodiment of the invention, the compensation circuit comprises a serial circuit and/or a parallel circuit of at least one inductance and/or at least one capacitance.

According to a preferred embodiment of the invention, the inductances are made up by bond wires provided between the transistors and the input and output terminals respectively. It is an advantageous feature of the present invention that the bond wires are used as connection and as inductance. This saves costs and space in the layout.

According to a preferred embodiment of the invention, the input network comprises parallel bond wires of a given length.

According to a preferred embodiment of the invention, the capacitances are embodied by a first conducting layer, an insulating layer and a second conducting layer which is connected to ground.

According to a preferred embodiment of the invention, the transistors are connected in parallel. It is an advantageous feature that the required power is provided not only from one transistor, but from parallel transistors. Therefore, each single transistor contribute a part to the total power. Following, even if there is a single transistor out of order then a total power with a little smaller power value is provided.

According to a preferred embodiment of the invention, the input networks are connected in parallel. Parallel input networks have the advantage that the power range input, is divided into several branches of the input networks. Therefore, the input power of each branch of the input network which can be operated is reduced.

According to a preferred embodiment of the invention, the output networks are connected in parallel. The advantage of the parallel output networks is in principle analogue to the advantage of the parallel input networks. The output power is divided into several branches. Therefore, the output power of each branch of the output network which can be operated is reduced.

According to a preferred embodiment of the invention, the compensation circuits are connected in parallel.

These and various other advantages and features of novelty which characterize the present invention are pointed out with particularity in the claims annexed hereto and forming a part hereof. However, for a better understanding of the invention, its advantages, and the object obtained by its use, reference should be made to the drawings which form a further part hereof, and to the accompanying descriptive matter in which there are illustrated and described preferred embodiments of the present invention.

Figure 6A:
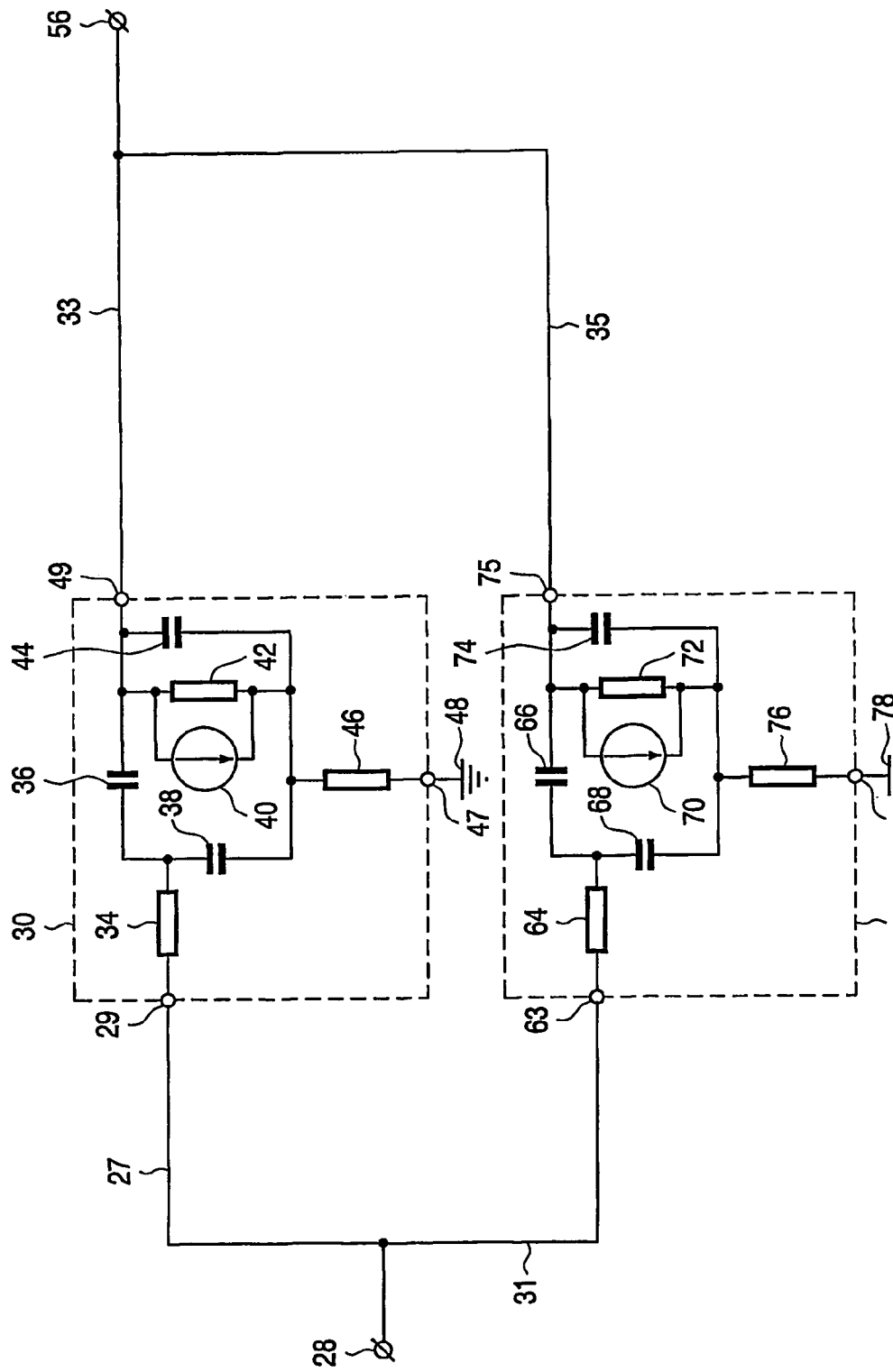
Figure 8:
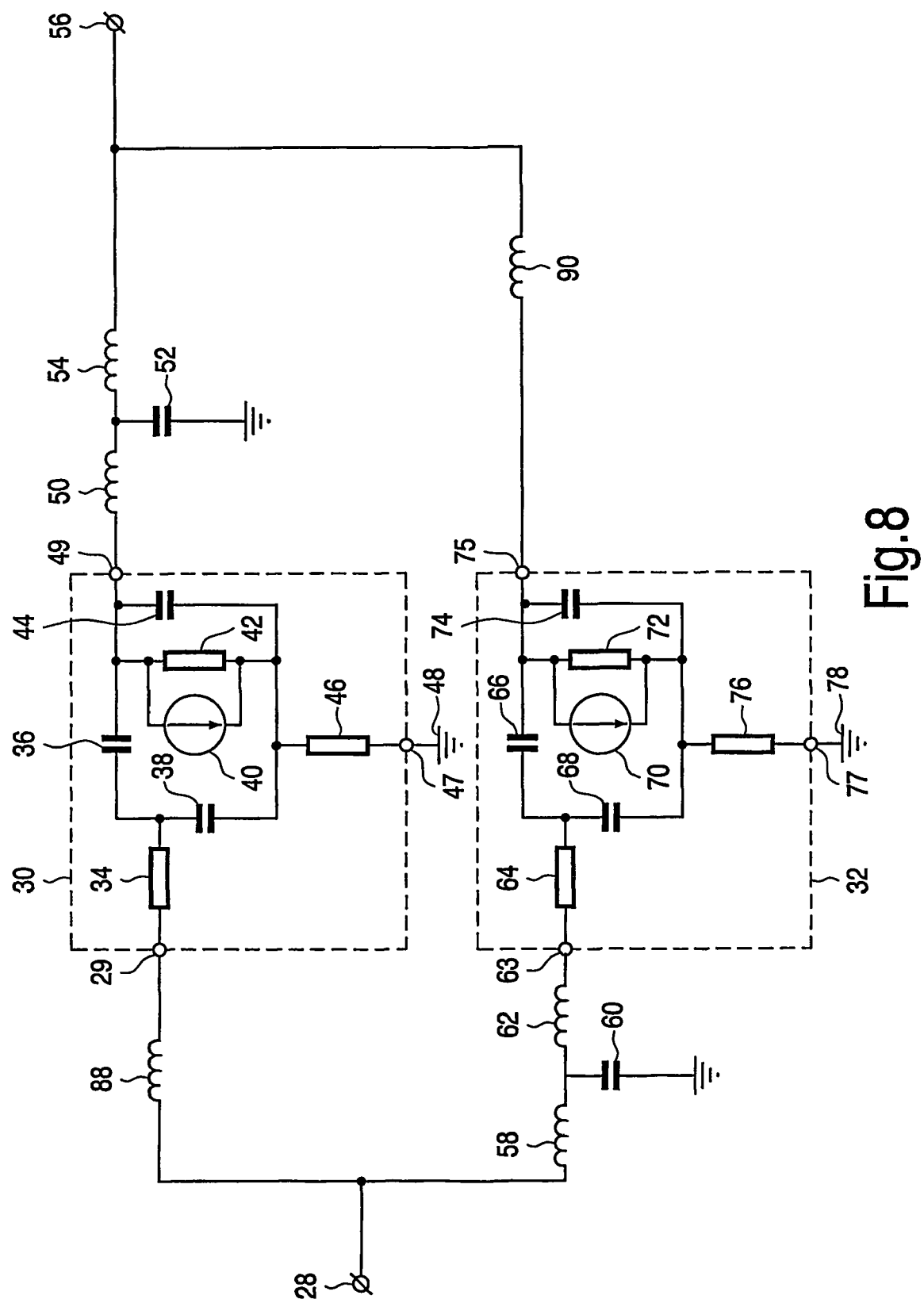
Figure 9:
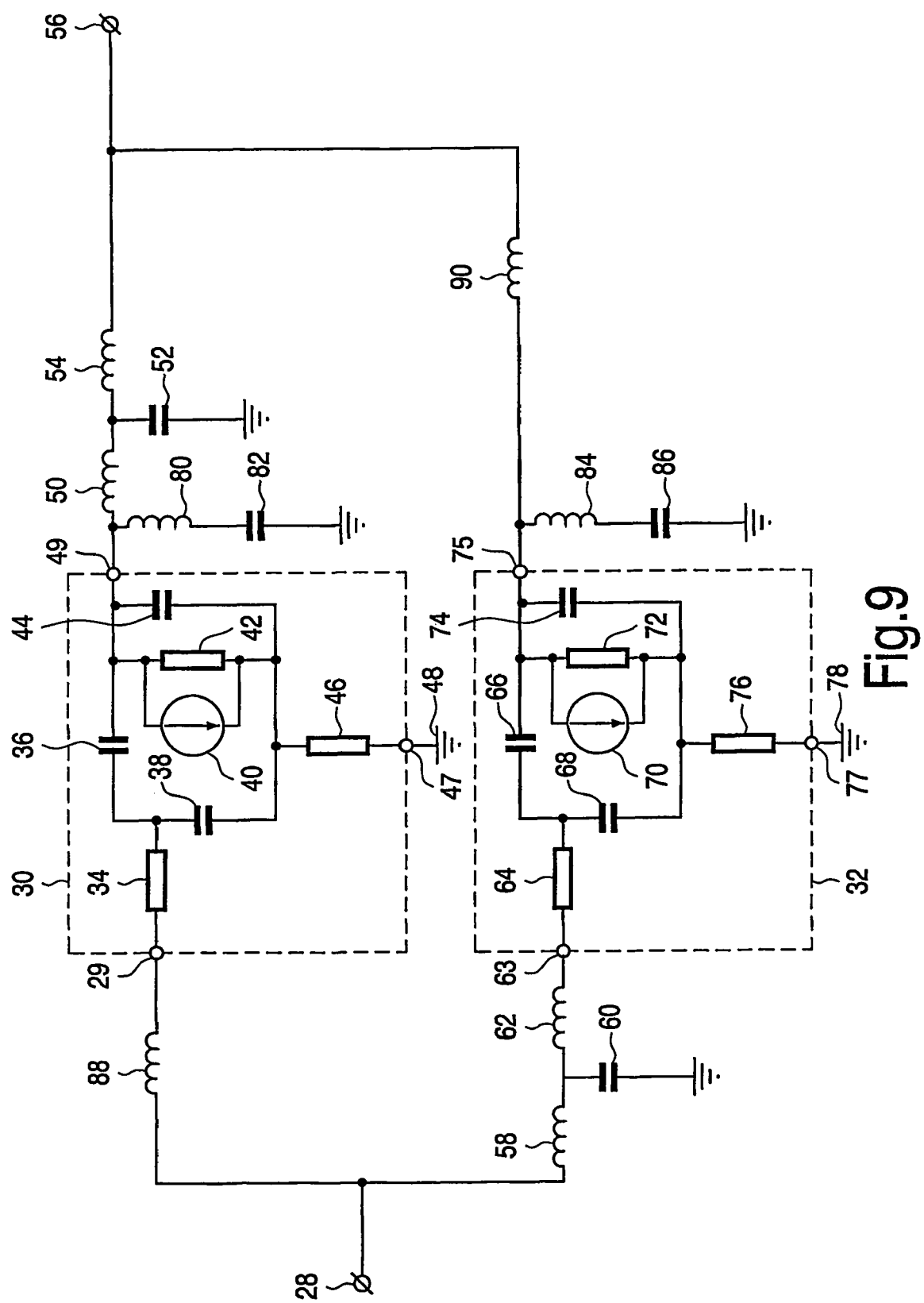
Figure 10:
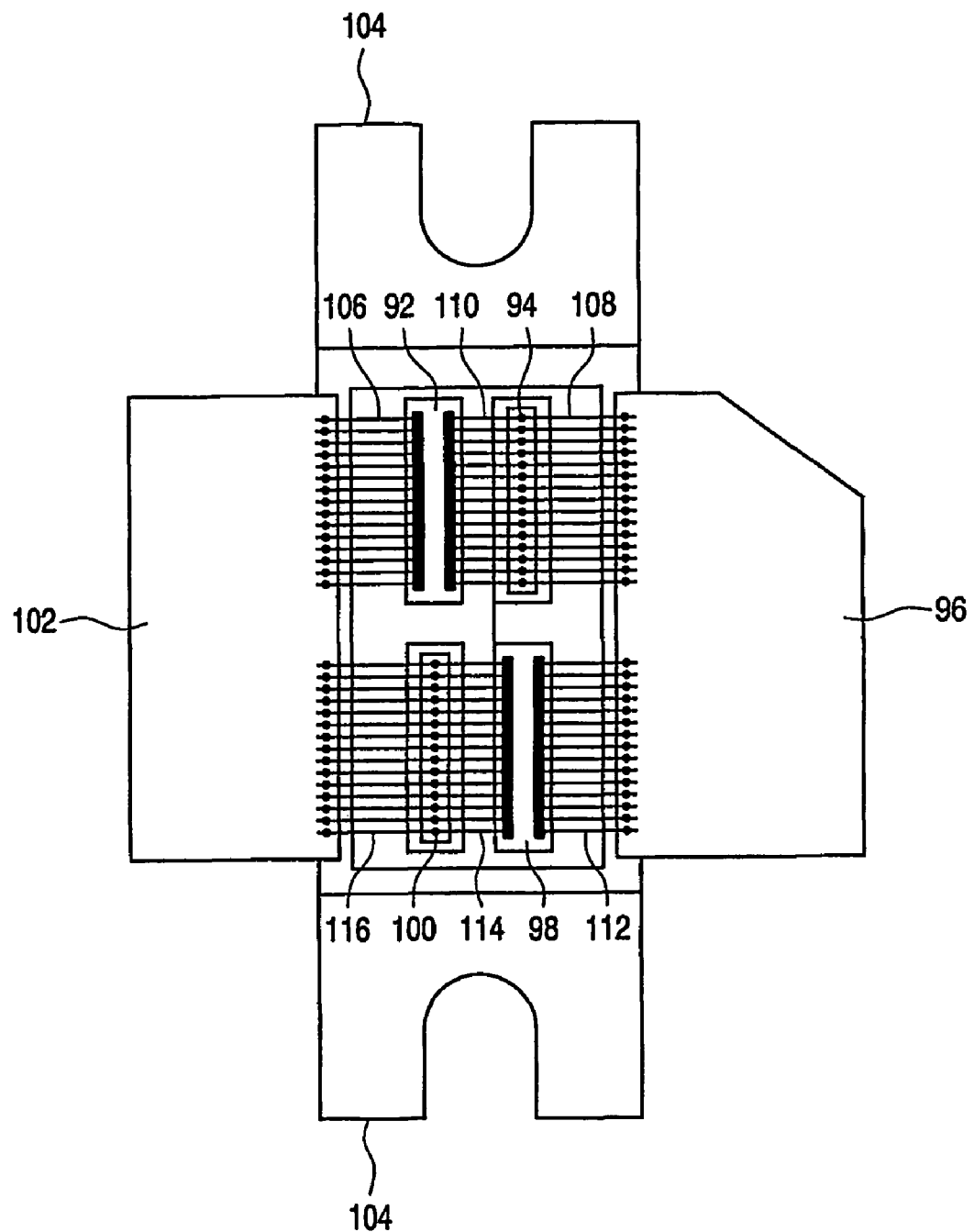
Figure 11:
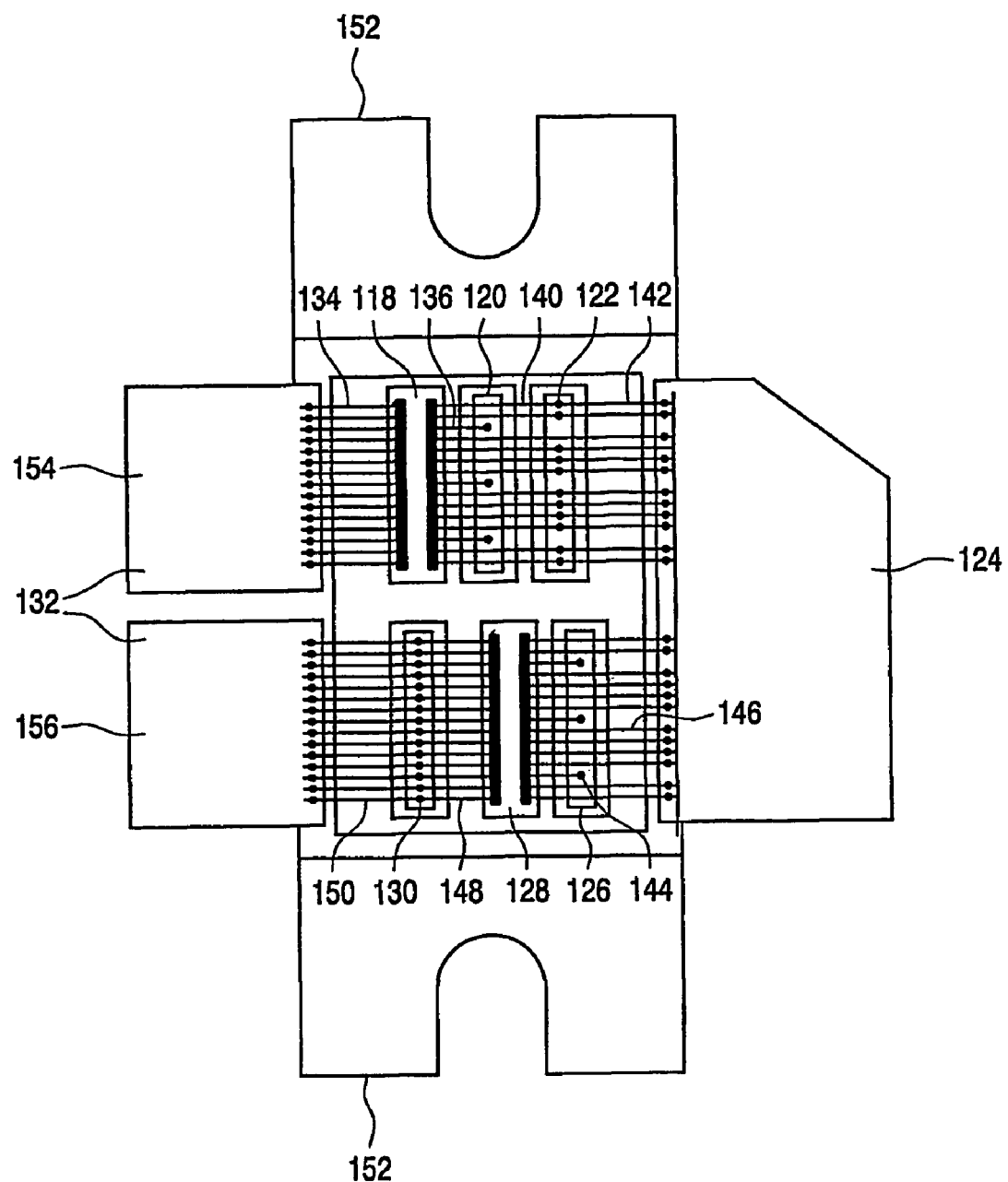
Figure 12:
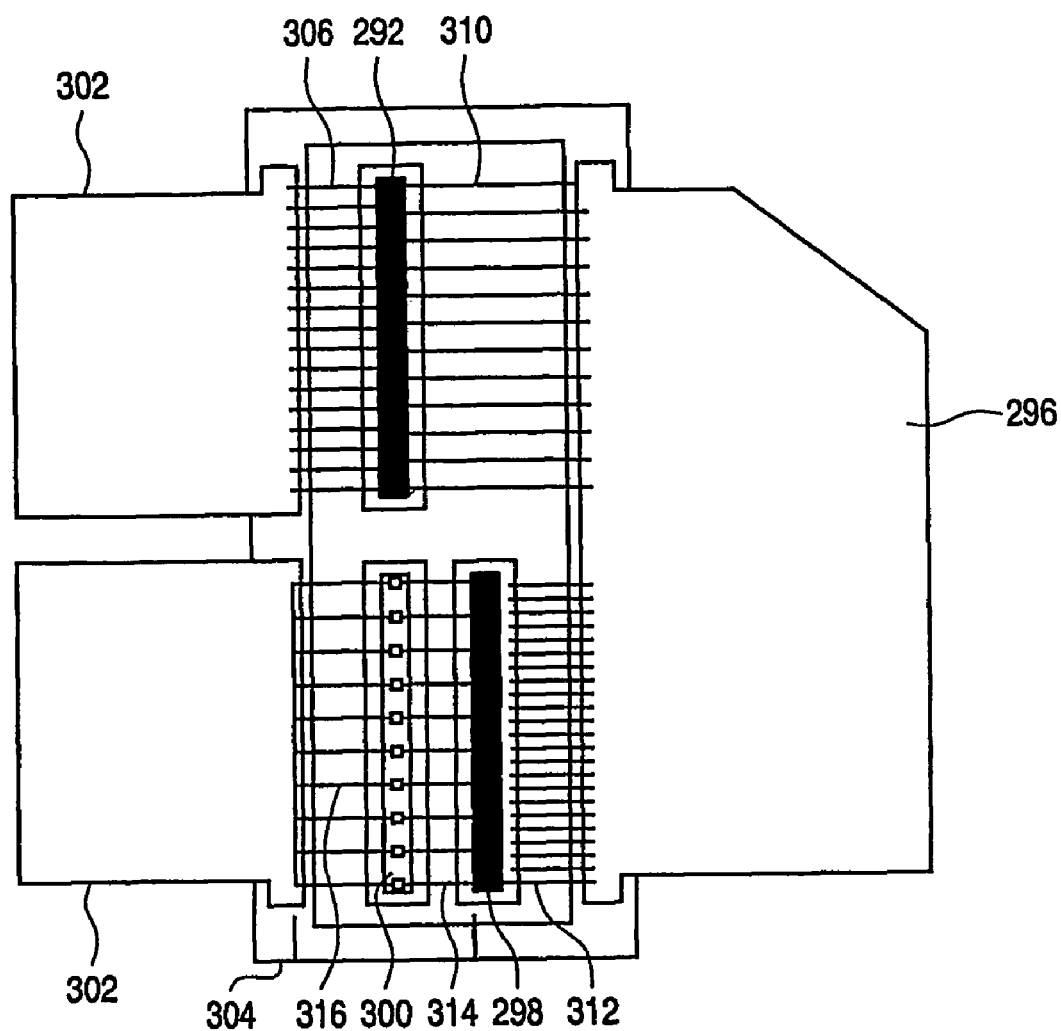

FIGS. 6A, 6B, 7, 8, and 9 show possible embodiments of the Doherty amplifier;

FIG. 10 shows the circuit package of FIG. 8;

FIG. 11 shows a circuit package of FIG. 9;

FIG. 12 shows a circuit package of FIG. 6A.

Figure 13:
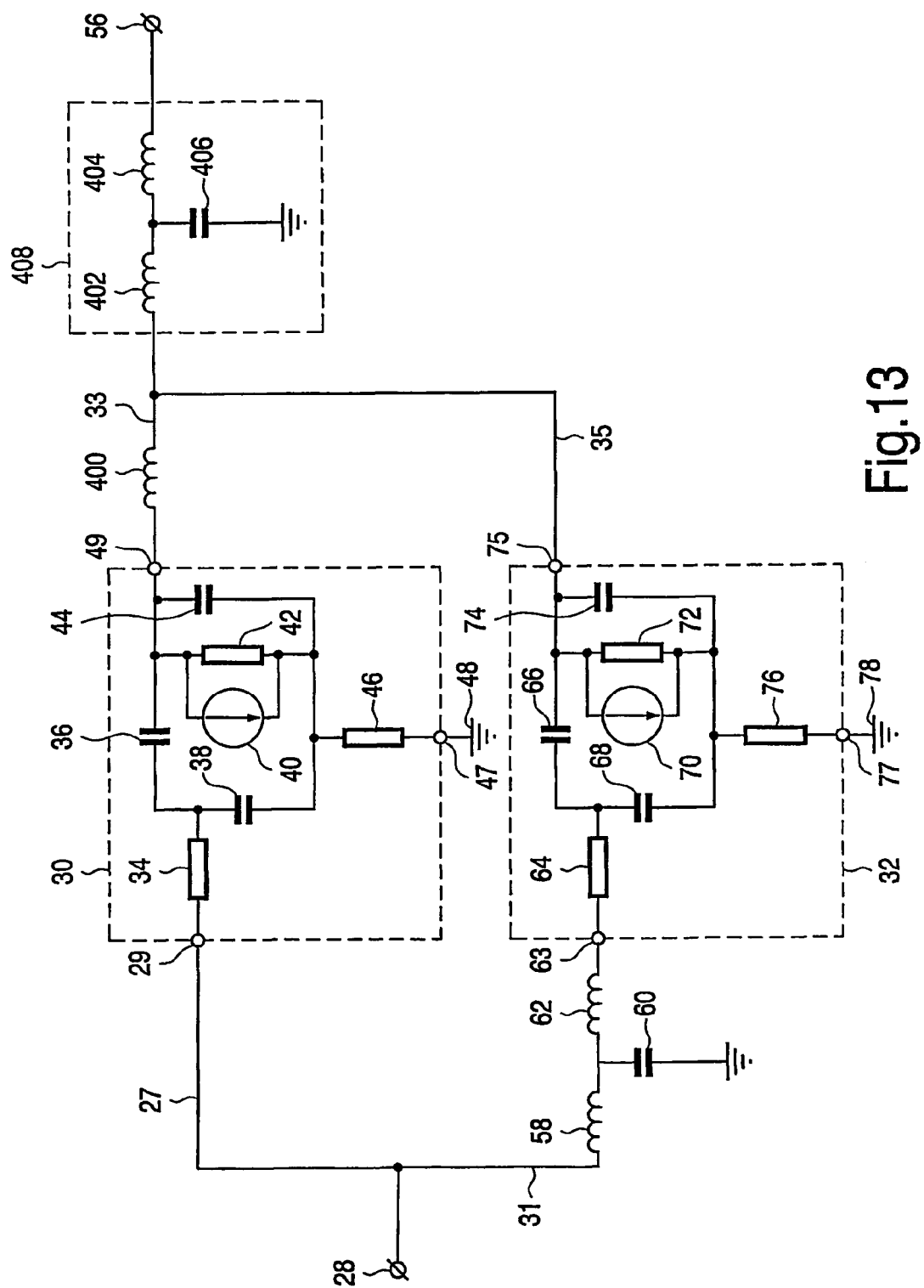
Figure 14:
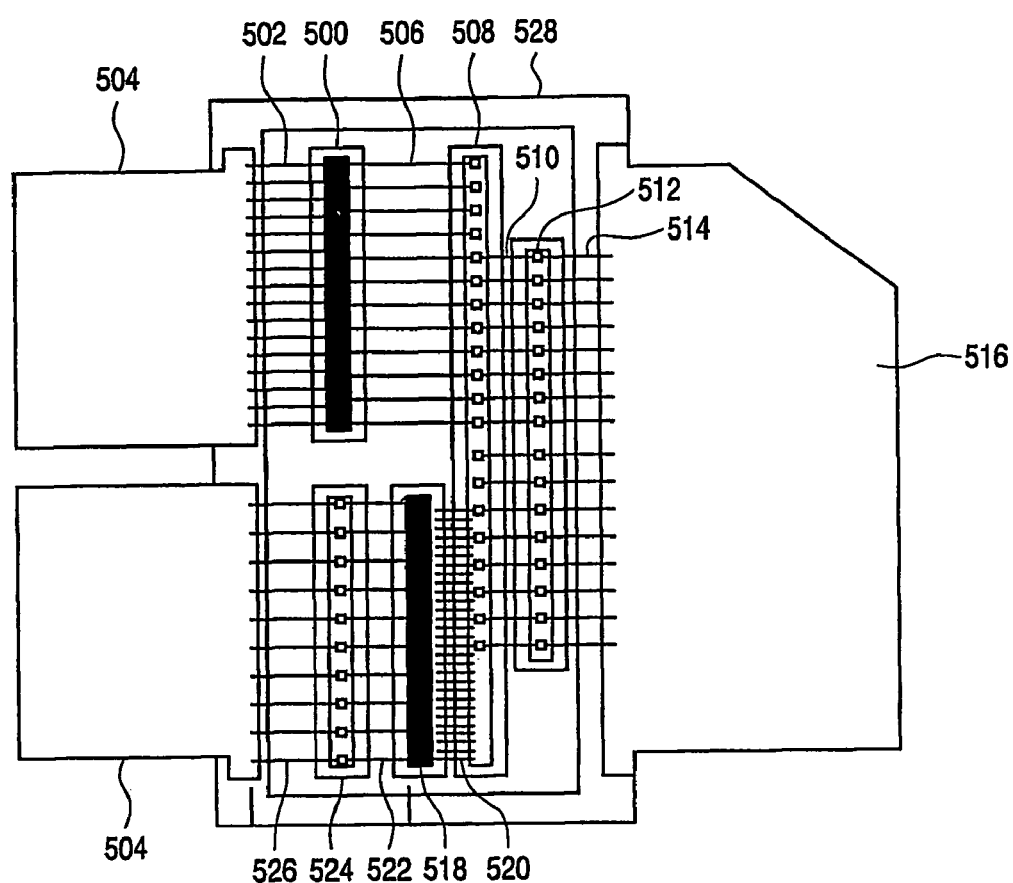

FIG. 13 shows a possible embodiment of the Doherty amplifier;

FIG. 14 shows a circuit package of FIG. 13.

Figure 1:
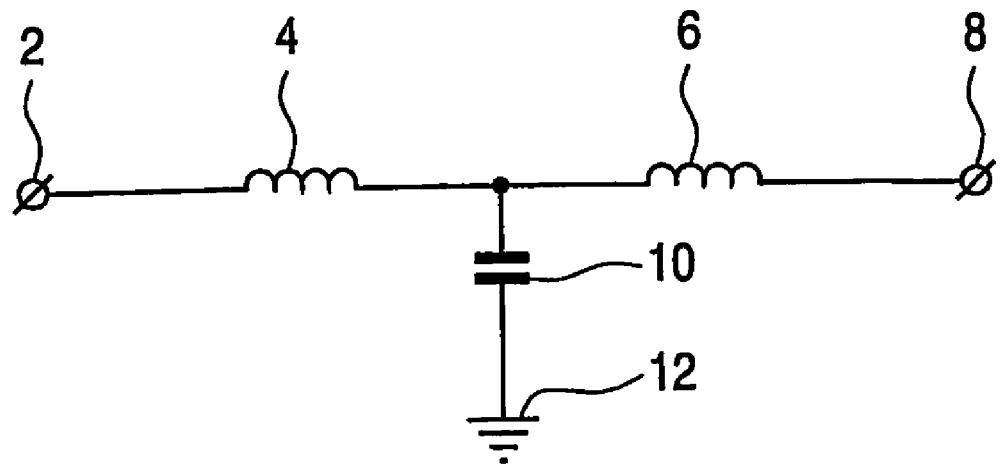
FIGS. 1 and 2 show different examples of a compact artificial transmission line.

FIG. 1 shows an embodiment of an artificial transmission line which is implemented inside the RF power transistor package close to the power transistor dies. The artificial transmission line comprise an input terminal 2 connected to the inductance 4 having an inductance value of 0,33 nH. The inductance 4 is connected on the other side to the inductance 6 having an inductance value of 0,33 nH and to the capacitance 10 having a capacitance value of 80 pF. The inductance 6 is connected on the other side to the output terminal 8. The capacitance 10 is connected in the other side to ground. Such an artificial transmission line in general can achieve a very low characteristic impedance, even below 1 Ohm, allowing a compact design. The artificial transmission line in theory should provide a phase shift around 90 degree within operational frequency band /at 900 MHz/.

Figure 2:
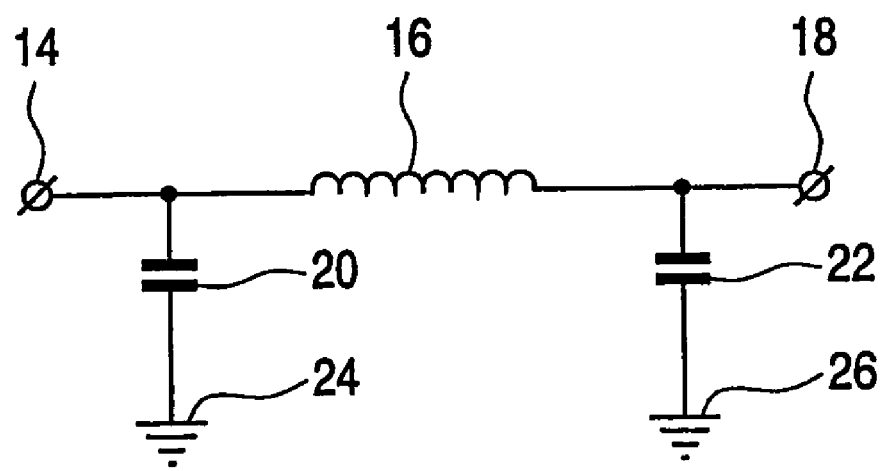

FIG. 2 comprises another embodiment of the artificial transmission line. The artificial transmission lines comprises an input terminal 14 connected to one side of the capacitance 20, 70 pF, and to one side of the inductance 16, 0,36 nH. The capacitance 20 is connected on the other side to ground 24. The inductance 16 is connected on the other side to the output terminal 18 and to one side of the capacitance 22, 70 pF. The other side of the capacitance 22 is connected to ground 26. This artificial transmission line provides a 90 degree phase shift at 900 MHz and has a characteristic impedance of 2 Ohm. The artificial transmission lines shown in FIG. 1 and FIG. 2 can be easily implemented inside traditional power transistor package. The artificial transmission line in low path filter configuration provides additional harmonic suppression at the output of the main amplifier/ about −10 dB for second harmonic 2fo/, serving for better carrier amplifier linearity. Traditional technology can provide high quality factor for these artificial transmission lines at very low impedance values and perfect repeatability.

The solution where the artificial transmission lines are built with capacitors, represented by MOS capacitors, and the inductances, represented by parallel gold bond wires, used in the discrete RF power transistor technology as a connecting media, removes two problems, existing in the Doherty amplifier with traditional microstrip line design.

The contradiction is removed between required low Zo, in the range of 0.5 to 5 Ohms, of the quarterwave length lines and the microstrip line technique limitations. In other words, the present invention removes the limits implied by distributed microstrip lines technique. So, a high power design, greater than 10 W, becomes feasible in very compact way.

Another contradiction is removed between the demand for compact design of modem amplifier and the possible size of microstrip lines used for Doherty concept, where the dimensions of the microstrip lines are growing drastically with demand for larger output power, which leads to lower required characteristic impedance of 90 degree transmission line transformer.

Figure 3:
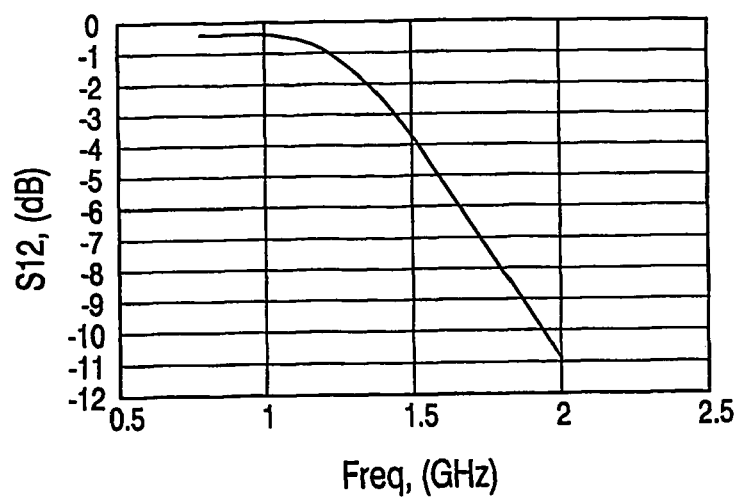
FIGS. 3 and 4 show simulated module and phase of S12 in the frequency band.

FIG. 3 shows the parameter S12 in dB in dependence of the frequency in GHz. The graph shows that up to 1 GHz the S12 parameter is nearly constant. Over 1 GHz the scattering parameter S12 slopes linearly down to roughly −11 dB at 2 GHz.

Figure 4:
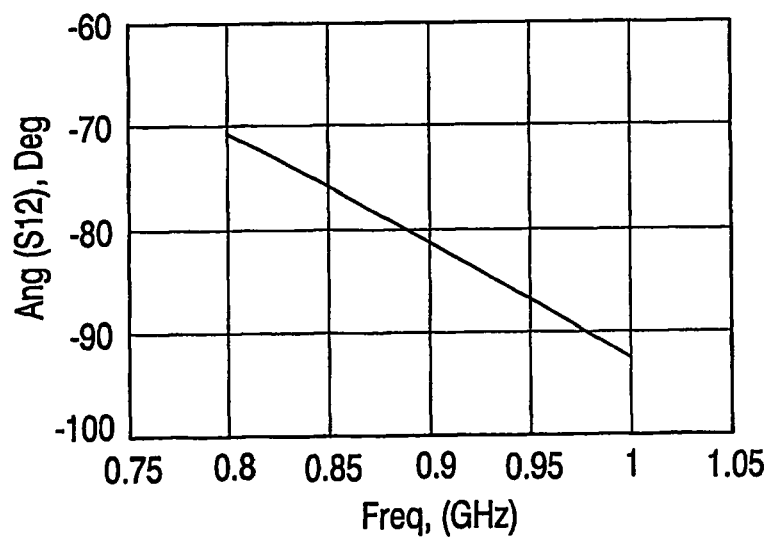

FIG. 4 shows the phase in degree of the scattering parameter S12 in dependence of the frequency in GHz. The phase slopes down linear from 0.8 GHz at a phase of roughly −71° down to roughly −93° at 1 GHz.

Figure 5:
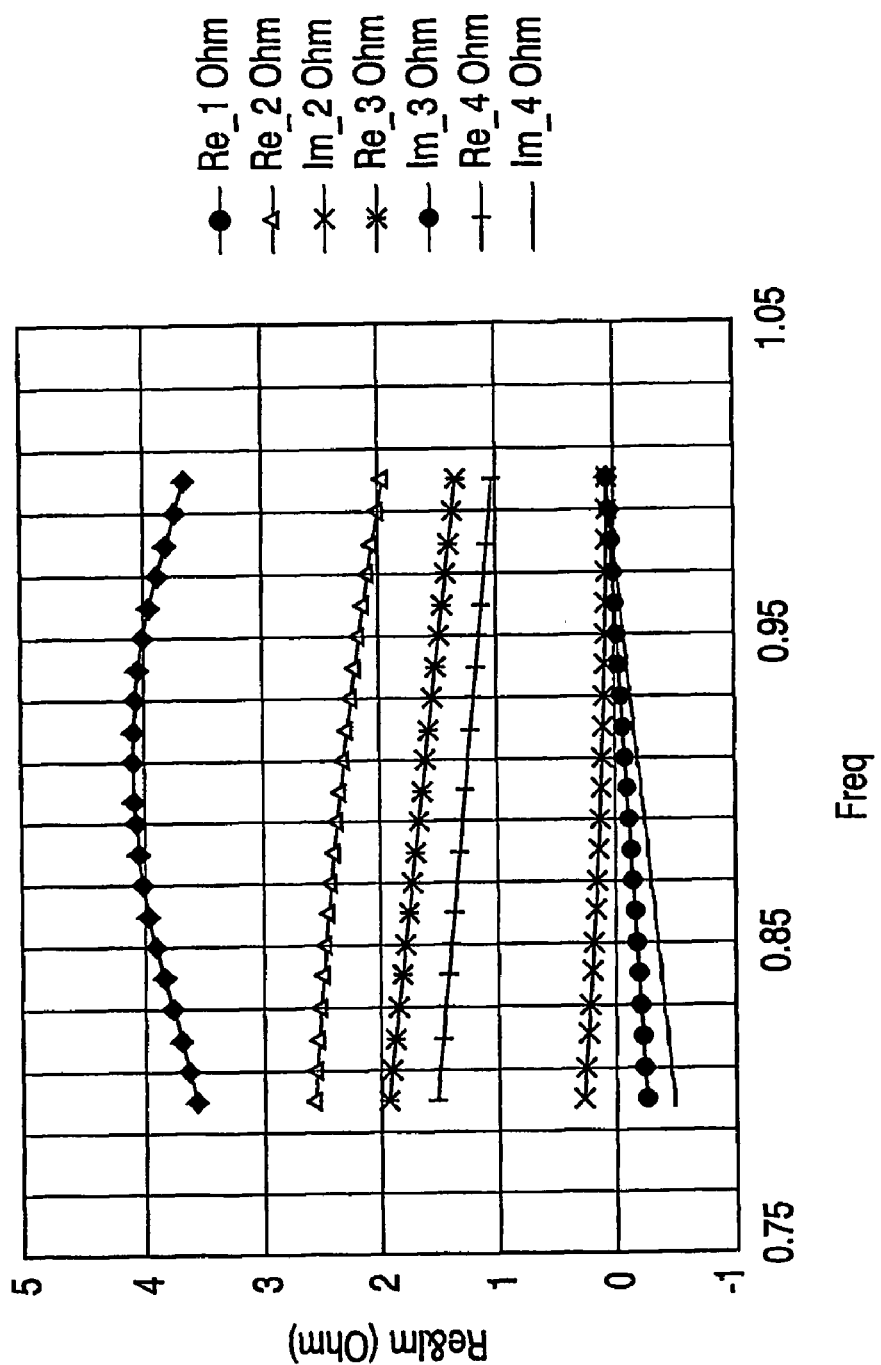
FIG. 5 shows the input impedance of the artificial transmission line versus load at the output.

FIG. 5 shows the input impedance of the artificial transmission line versus load at the output. FIG. 5 shows the real and imaginary part of impedance seen by transistor die output vs the impedance applied to the artificial line output/ in the range of 1 . . . 4 Ohms/. The graphs of the real part and of the imaginary part begin at a frequency of 0.8 GHz and end at a frequency of 1.0 GHz. For the impedance of 1 Ohm is only the real part shown. The real part of an impedance of 1 Ohm slopes up until 0.91 GHz and then the graph slopes down to 1 GHz. The graphs of the real parts of other input impedance values slope down linear from the frequency of 0.8 GHz down to the frequency of 1.0 GHz. The higher the real part is the lower is the input impedance. The lowest real part is generally at the end at 1 GHz. The imaginary parts have their minimum in the range of 1 GHz. The imaginary graphs of an input impedance of 3 and 4 Ohm slope up linear to the end at 1 GHz. The imaginary graph of an input impedance of 2 Ohm slopes down to the end at 1 GHz.

FIG. 6A shows a circuit diagram of the present invention. The input terminal 28 is connected through line 27 to the gate terminal 29 of the transistor 30. The transistor 30 represents the main amplifier. The transistor 30 is shown as an equivalent circuit. The equivalent circuit comprises a gate resistor 34 connected to the gate terminal 29 and on the other side connected to the gate source capacitance 38 and to the drain gate capacitance 36. The drain gate capacitance 36 is connected on the other side to the current source 40 and to the resistor 42 and to the output capacitance 44 and to the drain terminal 49. The output capacitance 44 is connected on the other side to the other side of the resistor 42, the other side of the current source 40, the other side of the gate source capacitance 38 and to the source resistor 46. The source resistor 46 is connected to the source terminal 47. The source terminal 47 is connected to ground 48. The drain terminal 49 is connected to the output terminal 56 through line 33 which is an artificial transmission line.

The input terminal 28 is connected to the input terminal through line 31. The transistor 32 is the peak amplifier. The shown equivalent circuit of the transistor 32 is identical to the shown equivalent circuit of the transistor 30. The resistor 64 is equal to the resistor 34. The capacitance 68 is identical to the capacitance 38. The capacitance 66 is identical to the capacitance 36. The current source 70 is identical to the current source 40. The resistor 72 is identical to the resistor 42. The capacitance 74 is identical to the capacitance 44. The resistor 76 is identical to the resistor 46. The source terminal 77 of the transistor 32 is connected to ground 78. The drain terminal 75 of the transistor 32 is connected to the output terminal 56 through line 35 which is an artificial transmission line.

In the above embodiment, the output parasitic capacitances of the transistors 30,32 are implemented in artificial transmission line such as the artificial line shown in FIG. 2, at the output of a Doherty amplifier. Physically the capacitances of the artificial line are embodied inside of both the peak transistor 32 and main transistor 30 dies.

Figure 6B:
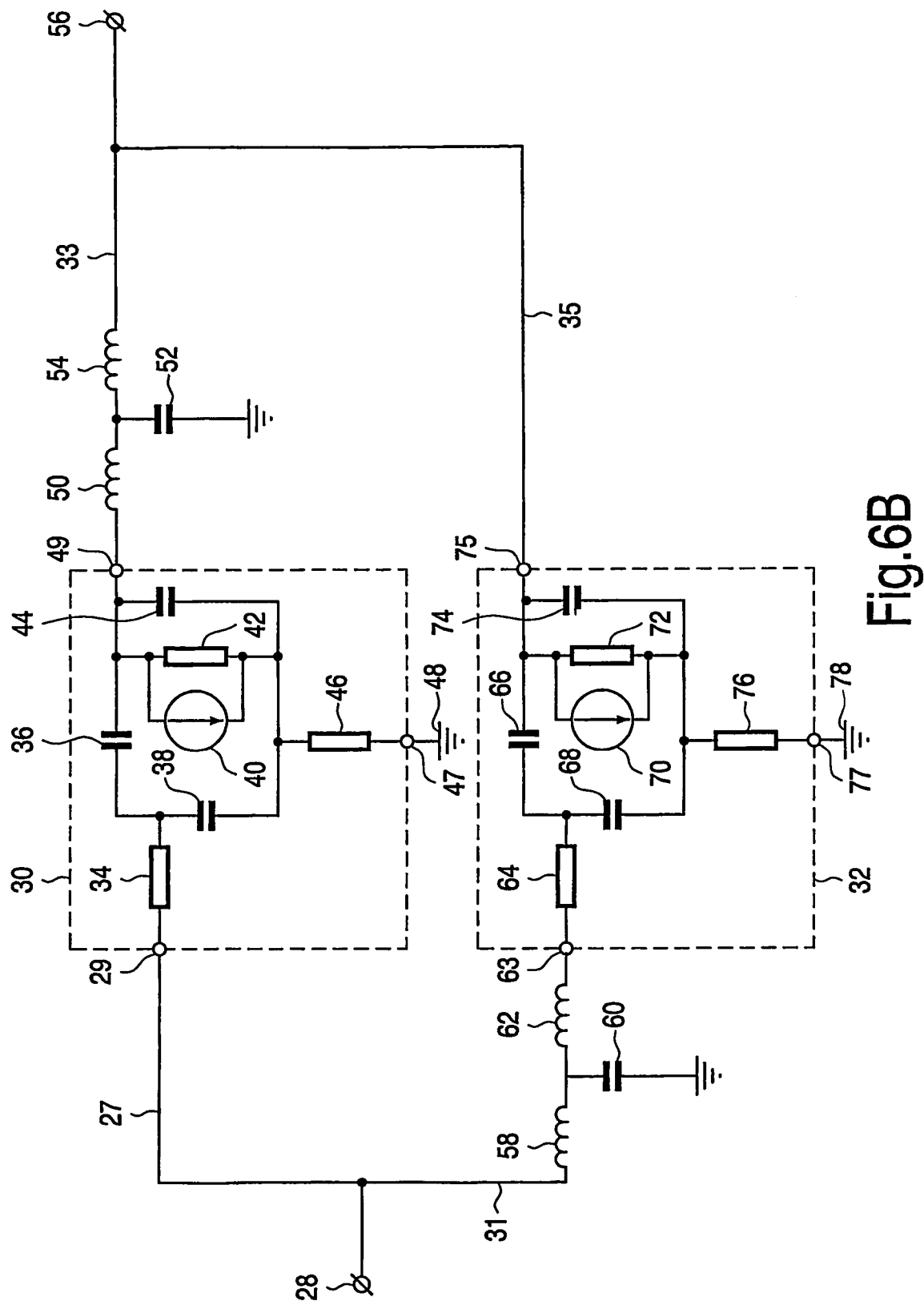

FIG. 6B shows a circuit diagram of the present invention similar to FIG. 6A. The input terminal 28 is connected trough line 27 to the gate terminal 29 of the transistor 30. The transistor 30 represents the main amplifier. The transistor 30 is shown as an equivalent circuit as in FIG. 6A. The drain terminal 49 is connected through line 33 to the output terminal 56. The line 33 is an artificial transmission line.

The transmission line 33 comprises an inductance 50 connected to the output terminal 49 of the transistor 30. The other side of the inductance 50 is connected to a capacitance 52 and to a inductance 54 which, in turn, is connected to the output terminal 56. The capacitance 52 is connected to ground.

The input terminal 28 is connected through line 31 to the input terminal 63. The line 31 includes an inductance 58. The inductance 58 is connected on the other side to a capacitance 60 and to an inductance 62. The capacitance 60 is connected on the other side to ground. The inductance 62 is connected on the other side to the gate terminal 63 of the transistor 32. The transistor 32 is the peak amplifier. The equivalent circuit of the transistor 32 is identical to the shown equivalent circuit of the transistor 30. The inductance 58 and the inductance 62 and the capacitance 60 form an artificial transmission line. The drain terminal 75 of the transistor 32 is connected to the output terminal 56 through line 35 which is an artificial transmission line.

In the above embodiments, the limitations for low characteristic impedance of the transmission line and the smaller transmission line size are removed, and the application frequency band, reproducibility, compact design, and the Doherty amplifier design flexibility is enhanced.

Figure 7:
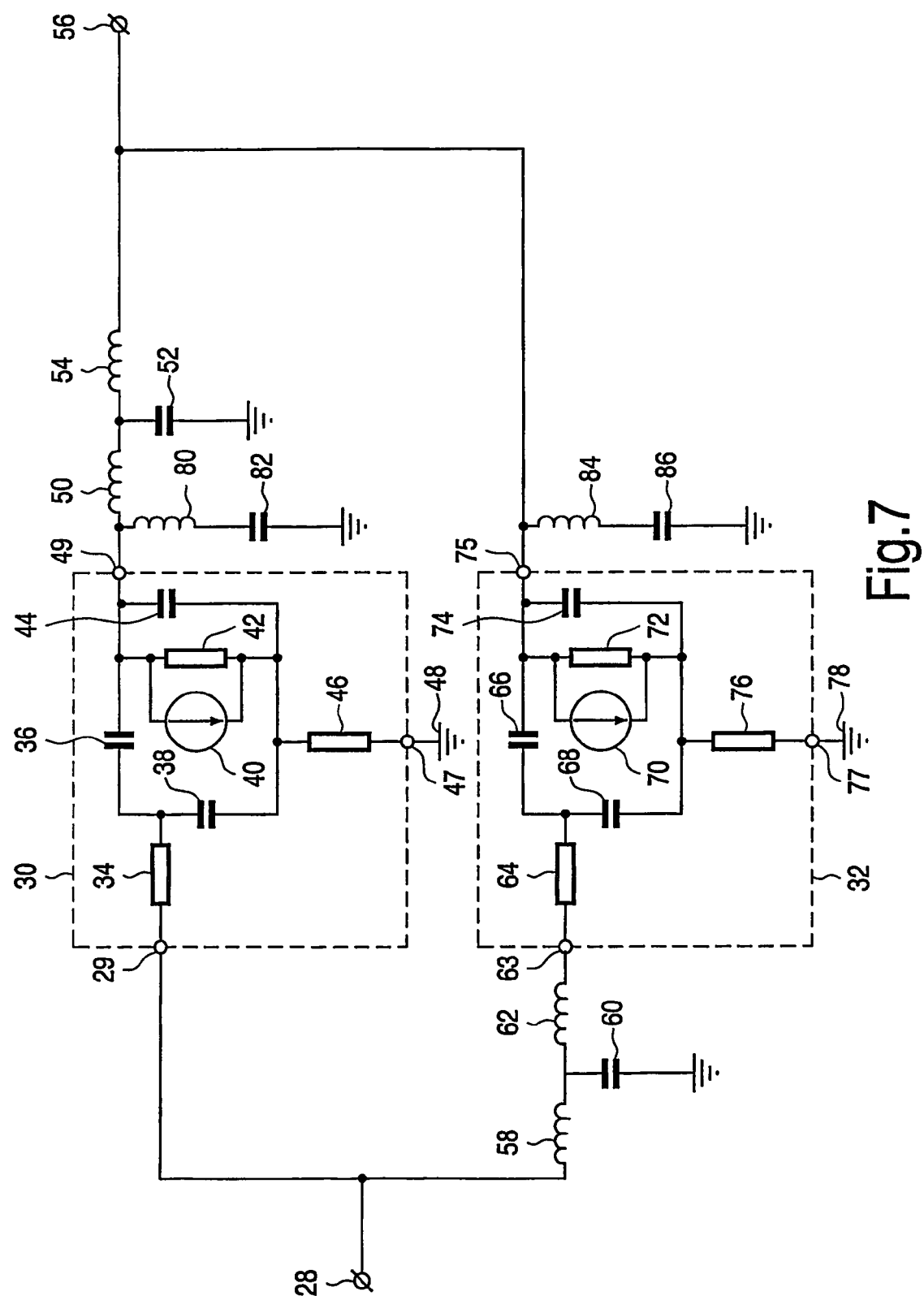

FIG. 7 shows in principle the same circuit as FIG. 6. Therefore, equal numbers for equal parts are used in FIG. 7. The only difference between FIG. 7 and FIG. 6 is that at the drain terminal 49 of transistor 30 and at the drain terminal 75 of the transistor 32 are compensation circuits applied. The compensation circuit at terminal 49 comprises a serial circuit of an inductance 80 and a capacitance 82. The inductance 80 is connected to the drain terminal 49. The inductance 80 is connected on the other side to the capacitance 82. The other side of the capacitance 82 is connected to ground. The compensation circuit compensates the output capacitance 44 of the transistor 30. In principle the same is done at terminal 75 of transistor 32. The compensation circuit comprising an inductance 84 and a capacitance 86 compensates the output capacitance 74. The compensation circuit is connected with one side of the inductance 84 to the terminal 75. The other side of the inductance 84 is connected to the capacitance 86. The other side of the capacitance 86 is connected to ground. Furthermore, the compensation circuits can be accomodated as a part of the 90° artificial transmission line.

FIG. 8 shows in principle the same circuit as FIG. 6. But in FIG. 8, the inductance 88 is connected between the input terminal 28 and the terminal 29 and the inductance 90 is connected between the terminal 75 and the output terminal 56. The inductances 88 and 90 are formed by bondwires and are used as an input network or an output network The object of the input and output network is to match the impedance of the transistor at the input and output terminals to the impedance at the terminals of the connected other circuit parts. A practical embodiment of FIG. 8 is shown in FIG. 10.

FIG. 9 shows a circuit, which is a combination of the circuits shown and described in FIG. 7 and FIG. 8. The present invention eliminates the contradiction between possible characteristic impedance of the microstrip line, lowest possible value is around 10 Ohm, and required values below 1 Ohm, which is a vital issue for the Doherty amplification technique at high power levels. Further, the present invention eliminates the contradiction between required physical dimensions of the transmission lines at the output of the active elements of the Doherty amplifier and achievable dimensions of the transmission lines in the RF and MW frequency band. Furthermore, the present invention miniaturizes the Doherty amplifier solution for high power amplifiers with output power greater than 10 W. Moreover, the present invention provides an easy way of Doherty technique implementation using a traditional technology in power amplifiers even at very high power level, greater than 300 W, which is impossible with a traditional microstrip line technique.

FIG. 10 shows a basic structure as an embodiment of the circuit of FIG. 8. The main amplifier transistor die 92 is connected by a plurality of bond wires 106 to the input lead of the Doherty amplifier 102. The main amplifier transistor 92 is connected by a plurality of parallel bond wires 110 to the capacitor 94 of the output artificial line. The capacitor 94 is connected by a plurality of parallel bond wires 108 to the output lead 96 of the Doherty amplifier. The peak amplifier transistor 98 is connected by a plurality of parallel bond wires 112 to the output lead 96 of the Doherty amplifier. The peak amplifier transistor 98 is connected by a plurality of parallel bond wires 114 to the capacitor 100 of the input artificial line. The capacitor 100 is connected by a plurality of parallel bond wires 116 to the input lead 102 of the Doherty amplifier. The circuit is mounted on a support layer 104.

FIG. 11 shows a structure of an embodiment of FIG. 9. The main amplifier transistor die 118 is connected to the input lead 154 of the Doherty amplifier by a plurality of parallel bond wires 134. The main amplifier transistor die 118 is connected to the compensation circuit 120 by a plurality of parallel bond wires 136. The output of the main amplifier transistor die 118 is connected to the capacitor 122 of the output artificial line by a plurality of parallel bond wires 140. The capacitor 122 of the output artificial line is connected to the output lead 124 of the Doherty amplifier by a plurality of parallel bond wires 142. The compensation circuit 126 is connected to the peak amplifier transistor die 128 via a plurality of parallel bond wires 144.

The peak amplifier transistor die 128 is connected to the output lead 124 by a plurality of parallel bond wires 146. The peak amplifier 128 is connected to the capacitor 130 of the input artificial line by a plurality of parallel bond wires 148. The capacitor 130 is connected to the input lead 156 of the Doherty amplifier by a plurality of parallel bond wires 150. The input lead 154 and the input lead 156 are concluded to a general input lead 132. The whole before described circuit is mounted on a substrate 152. The present invention is achieved by building an artificial transmission line using an existing traditional technology inside the traditional discrete power transistor package together with a power transistor die and a compensation circuit which provide the efficient, flexible and compact solution for very high power Doherty amplifiers.

FIG. 12 shows a simplified embodiment of the invention corresponding to the circuit of FIG. 6A. The main amplifier transistor die 292 is connected by a plurality of bond wires 306 to the input lead of the Doherty amplifier 302. The main amplifier transistor 292 is connected by a plurality of parallel bond wires 310 to output lead 296 of the Doherty amplifier. The peak amplifier transistor 298 is connected by a plurality of parallel bond wires 312 to the output lead 296 of the Doherty amplifier. The peak amplifier transistor 298 is connected by a plurality of parallel bond wires 314 to the capacitor 300 of the input artificial line. The capacitor 300 is connected by a plurality of parallel bond wires 316 to the input lead 302 of the Doherty amplifier. The circuit is mounted on a support layer 304.

FIG. 13 shows a circuit diagram of the present invention similar to FIG. 6B. The input terminal 28 is connected through line 27 to the gate terminal 29 of the transistor 30. The transistor 30 represents the main amplifier. The transistor 30 is shown as an equivalent circuit as in FIG. 6A. The drain terminal 49 is connected through line 33 comprising an inductance 400 to the impedance transformation circuit 408. The line 33 is an artificial transmission line including the output capacitance 44 of the transistor 30.

The impedance transformation circuit 408 comprises an inductance 402 connected to the line 33. The other side of the inductance 402 is connected to a capacitance 406 and to an inductance 404 which, in turn, is connected to the output terminal 56. The capacitance 406 is connected to ground.

The input terminal 28 is connected through line 31 to the input terminal 63. The line 31 includes an inductance 58. The inductance 58 is connected on the other side to a capacitance 60 and to an inductance 62. The capacitance 60 is connected on the other side to ground. The inductance 62 is connected on the other side to the gate terminal 63 of the transistor 32. The transistor 32 is the peak amplifier. The equivalent circuit of the transistor 32 is identical to the shown equivalent circuit of the transistor 30. The inductance 58 and the inductance 62 and the capacitance 60 form an artificial transmission line. The drain terminal 75 of the transistor 32 is connected to the line 33 and to the inductance 402 of the impedance transformation circuit 408 through line 35 which is an artificial transmission line.

FIG. 14 shows a simplified embodiment of the invention corresponding to the circuit of FIG. 13. The main amplifier transistor die 500 is connected by a plurality of bond wires 502 to the input lead 504 of the Doherty amplifier. The main amplifier transistor 500 is connected by a plurality of parallel bond wires 506 to a contact bank 508. The contact bank 508 is connected by a plurality of parallel bond wires 510 to a capacitor 512. The capacitor 512 is connected by a plurality of parallel bond wires 514 to a output lead 516. A peak amplifier transistor 518 is connected by a plurality of parallel bond wires 520 to the contact bank 508 of the Doherty amplifier. The peak amplifier transistor 518 is connected by a plurality of parallel bond wires 522 to a capacitor 524 of the input artificial line. The capacitor 524 is connected by a plurality of parallel bond wires 526 to the input lead 504 of the Doherty amplifier. The circuit is mounted on a support layer 528.

New characteristics and advantages of the invention covered by this document have been set forth in the foregoing description. It will be understood, however, that this disclosure is, in many respects, only illustrative. Changes may be made in details, particularly in matters of shape, size, and arrangement of parts, without exceeding the scope of the invention. The scope of the invention is, of course, defined in the language in which the appended claims are expressed.

The invention claimed is:

1. A high power Doherty amplifier circuit having at least one input terminal and at least one output terminal comprising:
    at least one carrier transistor forming a main amplifier stage;
    at least one peak transistor forming a peak amplifier stage;
    a first input line connecting the input terminal to an input of the carrier transistor and comprising an artificial transmission line;
    a second input line connecting the input terminal to an input of the peak transistor and comprising an artificial transmission line;
    a first output line connecting and the output terminal to an output of the carrier transistor; and
    a second output line connecting the output terminal to an output of the peak transistor, wherein the carrier transistor and the peak transistor are connected to a control circuit providing the desired dynamic controlling of amplification class parameters of the transistors.

2. The circuit of claim 1, wherein the first input line includes an inductor.

3. The circuit of claim 1, wherein the second input line comprises serial circuits and/or parallel circuits of at least one capacitance and/or at least one inductance.

4. The circuit of claim 3, wherein the second input line comprises an inductor.

5. The circuit of claim 1, wherein the first output line comprises serial circuits and/or parallel circuits of at least one capacitance and/or at least one inductance.

6. The circuit of claim 5, wherein the first output line comprises an inductor.

7. The circuit of claim 1, wherein the second output line comprises an inductor.

8. THe circuit of claim 1, wherein the carrier transistor and the peak transistor have individual transconductance parameters and threshold voltage values.

9. The circuit of claim 1, wherein the carrier transistor output and the peak transistor output are each connected to a compensation circuit.

10. The circuit of claim 1, wherein an impedance transformation circuit is connected between the input terminal/output terminal and the input line/output line.

11. A high power Doherty amplifier circuit package comprising:
    a support structure supporting circuit elements of the Doherty amplifier circuit;
    at least one input terminal and at least one output terminal both terminals being supported on the support structure;
    at least one carrier transistor forming a main amplifier stage and at least one peak transistor forming a peak amplifier stage both transistors being supported on the support structure;
    a first input line connecting the input terminal to an input of the carrier transistor;

a second input line connecting the input terminal to an input of the peak transistor;

a first output line connecting the output terminal to an output of the carrier transistor; and cpmprising an artificial transmission line; and a second output line connecting the output terminal to an output of the peak transistor and comprising an artificail transmission line, wherein the carrier transistor and the peak transistor are connected to a control circuit providing the desired dynamic controlling of amplification class parameters of the transistors.

12. The package of claim 11, wherein the input and output lines are artificial transmission lines comprising serial circuits and/or parallel circuits of at least one capacitance and/or at least one inductance.

13. The package of claim 11, wherein a compensation circuit is connected to the output of at least one of the carrier transistor and the peak transistor.

14. The package of claim 13, wherein the compensation circuit comprises a serial circuit and/or a parallel circuit of at least one inductance and/or at least one capacitance.

15. The package of claim 11, wherein inductances are made up by bond wires provided between the transistors and the input and output terminals respectively.

16. The package of claim 11, wherein the input lines comprise parallel bond wires of a given length.

* * * * *